US009583398B2

(12) United States Patent
Liaw

(10) Patent No.: US 9,583,398 B2
(45) Date of Patent: Feb. 28, 2017

(54) INTEGRATED CIRCUIT HAVING FINFETS WITH DIFFERENT FIN PROFILES

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/537,770

(22) Filed: Jun. 29, 2012

(65) Prior Publication Data

US 2014/0001562 A1   Jan. 2, 2014

(51) Int. Cl.
| H01L 27/092 | (2006.01) |
| H01L 21/8234 | (2006.01) |
| H01L 21/8238 | (2006.01) |
| H01L 27/11 | (2006.01) |
| H01L 27/088 | (2006.01) |
| H01L 29/66 | (2006.01) |

(52) U.S. Cl.
CPC ........... *H01L 21/823821* (2013.01); *H01L 21/823431* (2013.01); *H01L 27/0886* (2013.01); *H01L 27/0924* (2013.01); *H01L 27/1104* (2013.01); *H01L 29/6681* (2013.01)

(58) Field of Classification Search
CPC ..... H01L 21/823821; H01L 21/823431; H01L 21/845; H01L 27/0886; H01L 27/0924; H01L 27/1211; H01L 29/06; H01L 29/66795; H01L 29/66818; H01L 29/785; H01L 21/76232; H01L 29/7851; H01L 29/7853; H01L 29/41791; H01L 29/6681; H01L 27/1104; H01L 29/0657

USPC .......................... 257/368; 438/283, 197, 595
See application file for complete search history.

(56) References Cited

U.S. PATENT DOCUMENTS

| 7,112,858 | B2 * | 9/2006 | Inaba et al. ................... 257/401 |
| 7,700,445 | B2 | 4/2010 | Jang et al. |
| 8,110,466 | B2 * | 2/2012 | Shieh et al. .................. 438/268 |
| 8,264,032 | B2 * | 9/2012 | Yeh et al. ..................... 257/327 |
| 2004/0222477 | A1 * | 11/2004 | Aller ....................... H01L 21/84 257/412 |
| 2005/0035391 | A1 * | 2/2005 | Lee et al. ...................... 257/308 |
| 2005/0056892 | A1 * | 3/2005 | Seliskar ....................... 257/348 |
| 2005/0136617 | A1 * | 6/2005 | Jang ............................. 438/427 |
| 2005/0239242 | A1 * | 10/2005 | Zhu et al. .................... 438/199 |
| 2006/0046452 | A1 * | 3/2006 | Rios et al. .................... 438/595 |
| 2006/0063332 | A1 * | 3/2006 | Doyle et al. ................. 438/267 |
| 2006/0068531 | A1 * | 3/2006 | Breitwisch et al. ........... 438/149 |
| 2006/0081895 | A1 | 4/2006 | Lee et al. |
| 2007/0093054 | A1 | 4/2007 | Min et al. |
| 2007/0114612 | A1 * | 5/2007 | Ahn et al. ..................... 257/364 |

(Continued)

FOREIGN PATENT DOCUMENTS

| JP | 2007335821 | 12/2007 |
| JP | 2011009296 | 1/2011 |

(Continued)

*Primary Examiner* — Khiem D Nguyen
*Assistant Examiner* — Pauline Vu
(74) *Attorney, Agent, or Firm* — Slater Matsil, LLP

(57) ABSTRACT

An integrated circuit is provided. The integrated circuit includes a substrate, a first FinFET device supported by the substrate, the first FinFET device having a first fin with a non-tiered fin profile, and a second FinFET supported by the substrate, the second FinFET having a second fin with a tiered fin profile.

20 Claims, 14 Drawing Sheets

(56) References Cited

U.S. PATENT DOCUMENTS

| | | | |
|---|---|---|---|
| 2007/0158730 A1* | 7/2007 | Burnett et al. | 257/314 |
| 2007/0158756 A1* | 7/2007 | Dreeskornfeld et al. | 257/374 |
| 2007/0298599 A1 | 12/2007 | Jang et al. | |
| 2008/0014699 A1* | 1/2008 | Torek et al. | 438/257 |
| 2008/0102570 A1* | 5/2008 | Fischer et al. | 438/157 |
| 2008/0157225 A1* | 7/2008 | Datta et al. | 257/401 |
| 2008/0296702 A1* | 12/2008 | Lee et al. | 257/401 |
| 2008/0308848 A1* | 12/2008 | Inaba | 257/255 |
| 2009/0014798 A1* | 1/2009 | Zhu et al. | 257/351 |
| 2009/0039418 A1* | 2/2009 | Min et al. | 257/327 |
| 2009/0134472 A1* | 5/2009 | Inaba | 257/390 |
| 2009/0140294 A1* | 6/2009 | Adhikari et al. | 257/192 |
| 2009/0184358 A1* | 7/2009 | Lenoble et al. | 257/315 |
| 2010/0015778 A1* | 1/2010 | Lin et al. | 438/443 |
| 2010/0019321 A1* | 1/2010 | Cho et al. | 257/365 |
| 2010/0163842 A1* | 7/2010 | Lai et al. | 257/19 |
| 2010/0190308 A1* | 7/2010 | Orlowski et al. | 438/275 |
| 2011/0127610 A1 | 6/2011 | Lee et al. | |
| 2011/0128710 A1 | 6/2011 | Kuo et al. | |
| 2011/0133285 A1* | 6/2011 | Liaw | 257/368 |
| 2011/0260253 A1 | 10/2011 | Inaba | |
| 2012/0049294 A1* | 3/2012 | Chen et al. | 257/401 |
| 2012/0228676 A1* | 9/2012 | Tan et al. | 257/255 |
| 2012/0292715 A1* | 11/2012 | Hong | H01L 21/845 257/392 |
| 2013/0175638 A1* | 7/2013 | Ho | H01L 29/785 257/401 |
| 2013/0309838 A1* | 11/2013 | Wei et al. | 438/424 |

FOREIGN PATENT DOCUMENTS

| | | | |
|---|---|---|---|
| JP | 2011009296 A * | 1/2011 | H01L 21/76 |
| KP | 10-2007-0064346 | 6/2007 | |
| KR | 1020060034531 A | 4/2006 | |
| KR | 10-0739656 | 7/2007 | |
| WO | 2006044349 A2 | 4/2006 | |
| WO | 2010150429 A1 | 12/2010 | |

* cited by examiner

2nd lithography and Si etch

3rd lithography and Si etch

STI fill and HM removing to finish the Final fin structures

INTEGRATED CIRCUIT HAVING FINFETS WITH DIFFERENT FIN PROFILES

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate field-effect transistors (MuGFETs) were developed. These devices not only improve areal density, but also improve gate control of the channel.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely two fin field effect transistors (FinFETs) supported by a single substrate but each having fins with different fin profiles. The embodiments of the disclosure may also be applied, however, to a variety of semiconductor devices. Hereinafter, various embodiments will be explained in detail with reference to the accompanying drawings.

Figure 1:
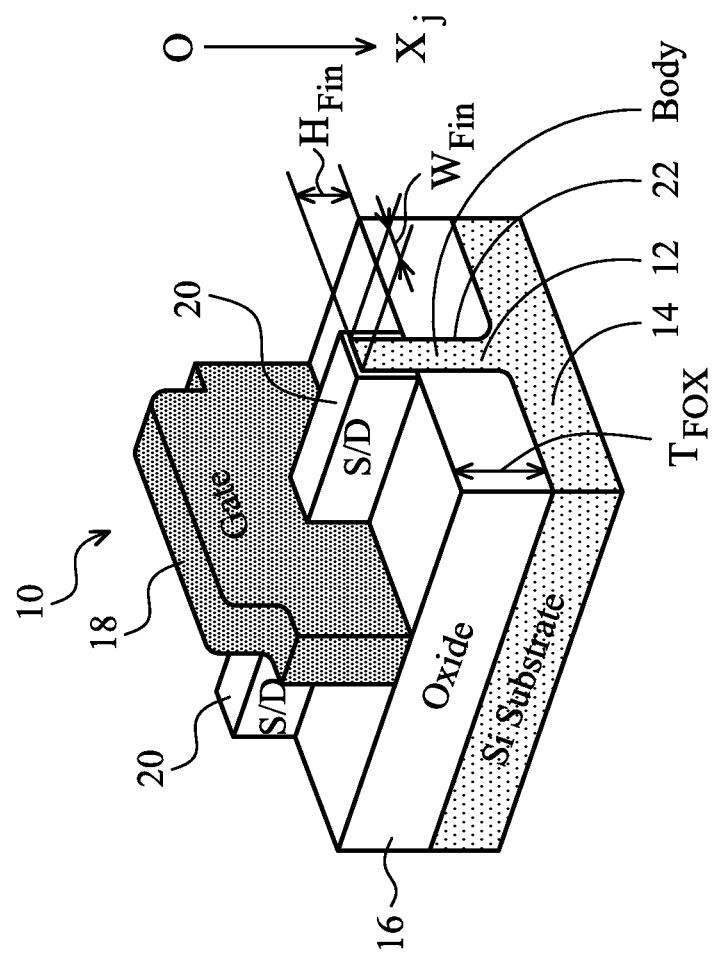
FIG. 1 illustrates an embodiment FinFET having a non-tiered fin.

Referring now to FIG. 1, a first FinFET 10 is illustrated. The first FinFET device 10 includes a first fin 12 projecting upwardly from an underlying substrate 14 and embedded within an oxide layer 16 or other suitable insulating region (e.g., a shallow trench isolation (STI) region). In addition, the first FinFET device 10 also includes a gate electrode structure 18 formed over the first fin 12 between source/drain regions 20. As shown, a fin profile 22 (i.e., periphery) of the first fin 12 is generally uniform from top to bottom. In other words, opposing sidewalls of the first fin 22 do not include a step or shoulder. As such, the first fin 12 is referred to herein as having a non-tiered fin profile.

Figure 2:
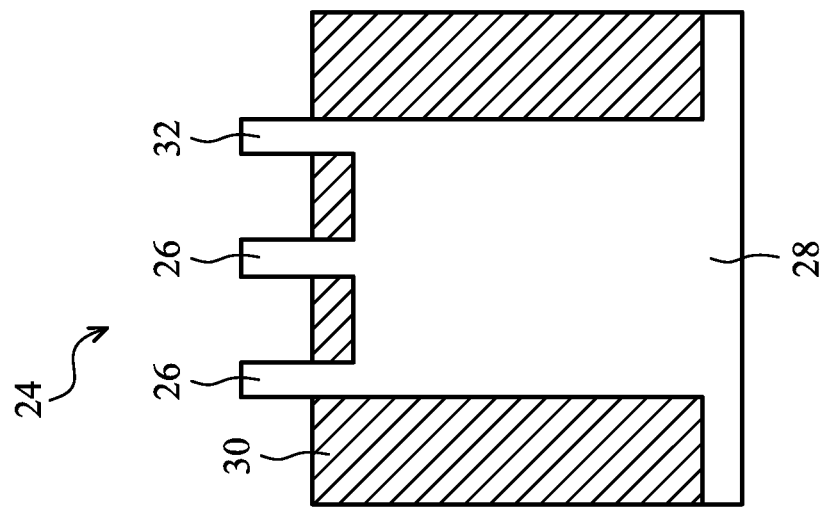
FIG. 2 illustrates an embodiment FinFET having several non-tiered fins.

Referring now to FIG. 2, a second FinFET 24 is illustrated. The second FinFET 24 includes several second fins 26 projecting upwardly from an underlying substrate 28 and embedded within an oxide layer 30 or other suitable insulating region (e.g., a shallow trench isolation (STI) region). While not shown, the second FinFET device 24 also includes one or more gate electrode structures formed over the second fins 26 between source/drain regions. As shown, each of the second fins 26 has a fin profile 32 without a step or shoulder on both sides of the second fin 26. In other words, sidewalls of the second fins 26 do not include a step or shoulder. As such, the second fins 26 are also referred to herein as having a non-tiered fin profile.

Figure 3:
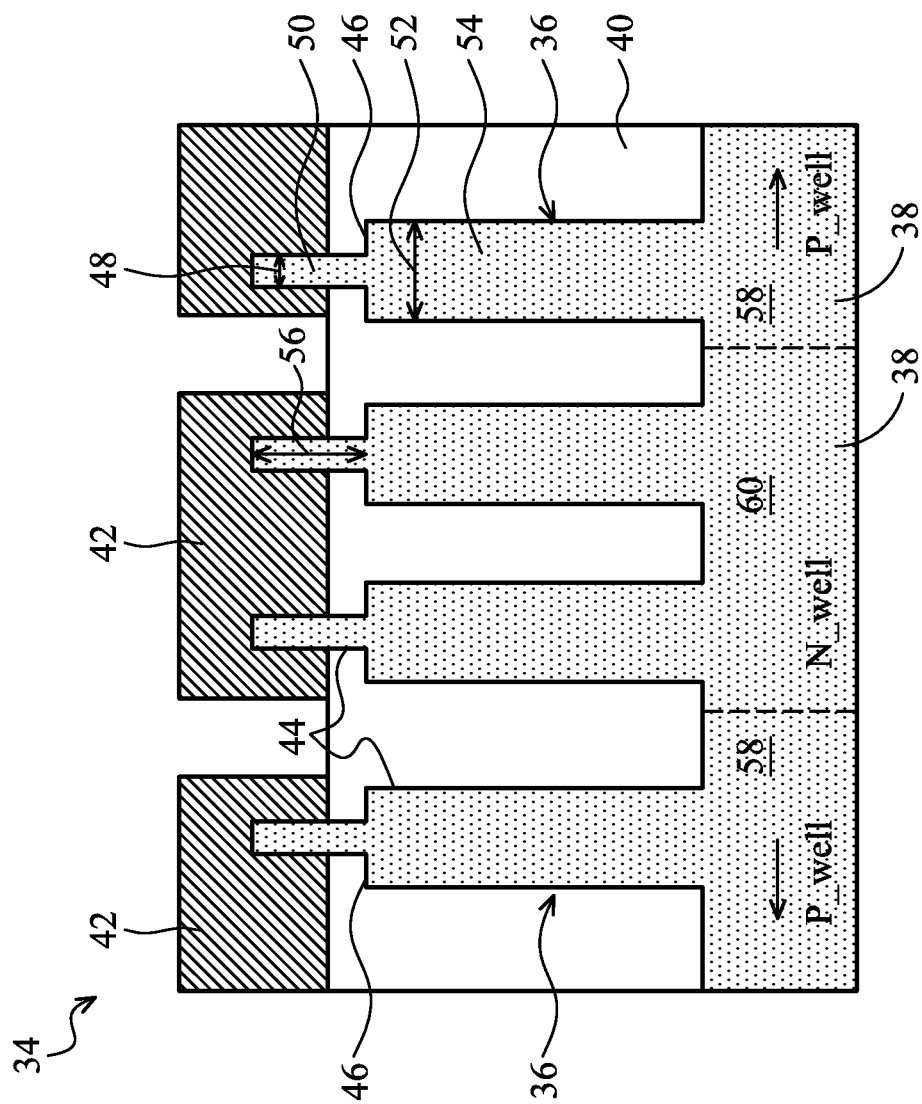
FIG. 3 illustrates an embodiment FinFET having several tiered fins.

Referring now to FIG. 3, a third FinFET 34 is illustrated. The third FinFET 34 includes third fins 36 projecting upwardly from an underlying substrate 38 and embedded within an oxide layer 40 or other suitable insulating region (e.g., a shallow trench isolation (STI) region). The third FinFET 34 also includes gate electrode structures 42 formed over the third fins 36 between source/drain regions (not shown). As shown, a fin profile 44 of the third fins 36 is not uniform from top to bottom. In other words, opposing sidewalls of the third fins 36 each include a step or shoulder 46. As such, the third fins 36 are referred to herein as having a tiered fin profile.

As shown in FIG. 3, a width 48 of an upper tier 50 (i.e., a first stage) of the third fins 36 is less than a width 52 of a lower tier 54 (i.e., a second stage). Notably, the upper tier 50 and the lower tier 54 intersect or have an interface at the shoulder 46. In an embodiment, the width 52 of the lower tier 54 of the third fins 36 is at least twice the width 48 of the upper tier 50. In an embodiment, a height 56 of the upper tier 50 is less than about fifty nanometers (50 nm).

As shown in FIG. 3, some of the third fins 36 may be disposed above a p-well 58 formed in the substrate 38 while other third fins 36 are disposed above an n-well 60. It should be appreciated that other well configurations are also contemplated depending on the doping of, for example, the first, second, and third FinFETs 10, 24, 34.

Figure 4B:
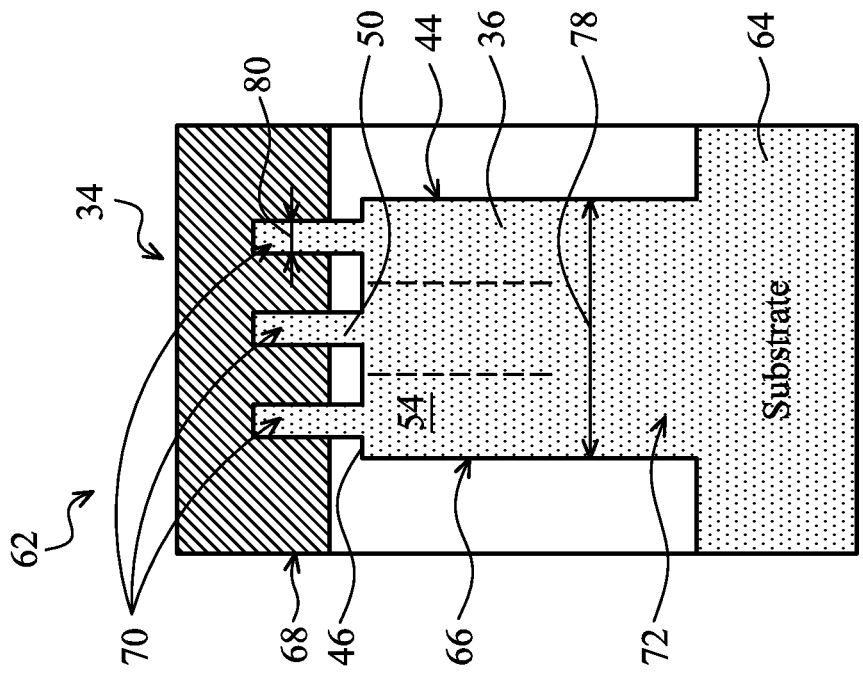
FIG. 4 illustrates an embodiment integrated circuit device including the FinFET of FIG. 1 with non-tiered fins and the FinFET of FIG. 3 with tiered fins on a single substrate.
Figure 4A:
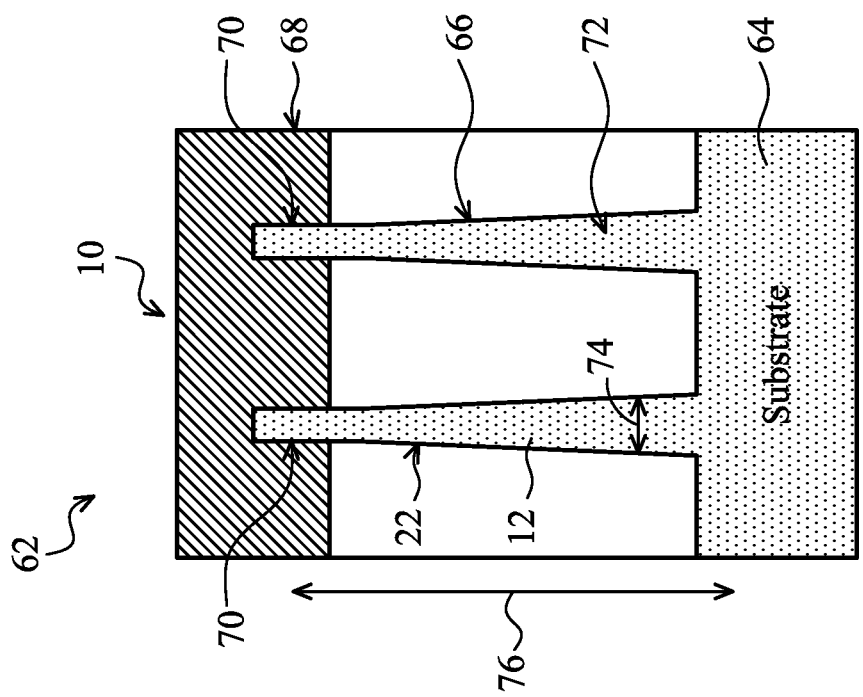

Referring now to FIG. 4, an embodiment integrated circuit 62 is illustrated. The integrated circuit 62 includes a FinFET with non-tiered fins (e.g., either FinFET 10 of FIG. 1 or FinFET 24 of FIG. 2) and another FinFET with tiered fins (e.g., FinFET 34 of FIG. 3) on a single substrate 64 (which is shown in two portions in FIG. 4). For the purposes of illustration, a FinFET similar to FinFET 10 of FIG. 1 has been included in FIG. 4. Even so, it should be appreciated that a FinFET similar to the FinFET 24 of FIG. 2 could replace the FinFET 10 of FIG. 1 in another embodiment.

As will be more fully explained below, the configuration of integrated circuit 62, which employs FinFETs with both tiered and non-tiered fins, permits both high density circuits (e.g., a static random access memory (SRAM) cell, a dynamic random access memory (DRAM) cell, a fresh cell, or an SRAM pull-up transistor) and speed critical circuits (e.g., a logic device, an SRAM pull-down transistor, an SRAM pass-gate transistor) to be formed on the shared substrate 64. As such, the integrated circuit 62 of FIG. 4 offers both area and device performance optimization.

Still referring to FIG. 4, the embodiment integrated circuit device 62 includes both the first FinFET 10 (FIG. 1) and the third FinFET 34 (FIG. 3) on the same substrate 68. Therefore, the integrated circuit 62 includes a plurality of the first fins 12 whose fin profile 22 is non-tiered and a plurality of the third fins 36 whose fin profile 44 is tiered. As shown, each of the first fins 12 and the third fins 36 is partially embedded in STI regions 66, is covered by a gate electrode structure 68, and includes a channel region 70. In addition, well regions 72 are formed in the first fins 12 and in the third fins 36.

In addition, in an embodiment the first, second, and third FinFETs 10, 24, 34 may be either p-type or n-type MOSFET devices. In an embodiment, both the first and second FinFETs 10, 24 and the third FinFET 34 are p-type MOSFETS. In an embodiment, the source/drain regions of the first, second, and third FinFETs 10, 24, 34 may be formed from silicon (Si), germanium (Ge), silicon germanium (SiGe), silicon germanium carbon (SiGeC), or some combination thereof.

In an embodiment, the first fins 12 in FIG. 4 have a width 74 that increases from top to bottom. In other words, the width 74 tapers away or diminishes as the first fins 12 project away from the substrate 64. In another embodiment, the first fins 12 may have a width 74 that remains generally constant over an entire length 76.

As shown in FIG. 4, in an embodiment the lower tiers 54 of the several third fins 36 (which are distinguished by dashed lines) are merged together. Even so, each of the third fins 36 still includes a step or shoulder 46 at an interface of the upper tier 50 and the lower tier 54. An overall width 78 of merged lower tiers 54 is between about 30 nm and about 5000 nm while the width 80 of the upper tier 50s between about 3 nm and about 20 nm.

Figure 5B:
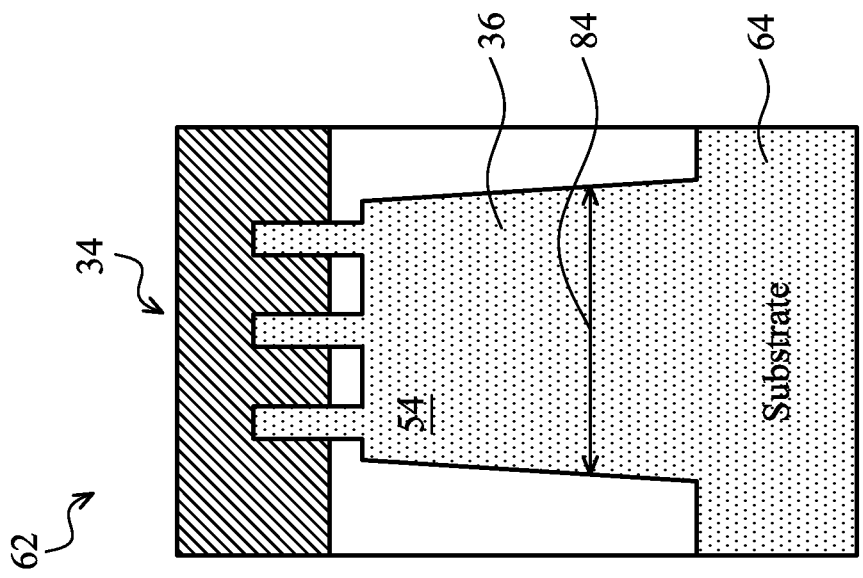
FIG. 5 illustrates an embodiment integrated circuit device including the FinFET of FIG. 1 with non-uniform non-tiered fins and the FinFET of FIG. 3 with tiered fins on a single substrate.
Figure 5A:
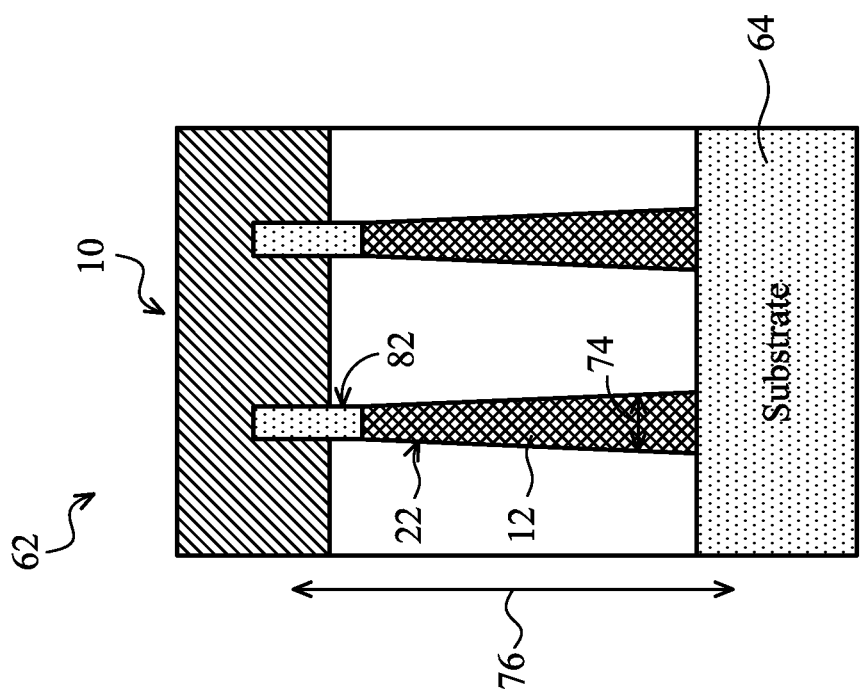

Referring now to FIG. 5, in an embodiment a fin profile 22 of the first fin 12 is non-uniform over the length 76. Indeed, as shown in FIG. 5, a profile angle formed by the bottom surface of the fin and a left sidewall of the fin is about seventy-five degrees and the profile angle formed by the top surface and the left sidewall is about ninety degrees. A profile angle in a central portion 82 of the first fin 12 in FIG. 5 is about eighty-four degrees. Despite the different angles, the fin profile in FIG. 5 still transitions smoothly from top to bottom such that the first fins 12 are considered non-tiered. In other words, the first fins 12 do not include a step or shoulder. Still referring to FIG. 5, in an embodiment the width 84 of the lower tier 54 of the merged third fins 36 may increase as the third fins 36 progress toward the substrate 64.

Figure 6:
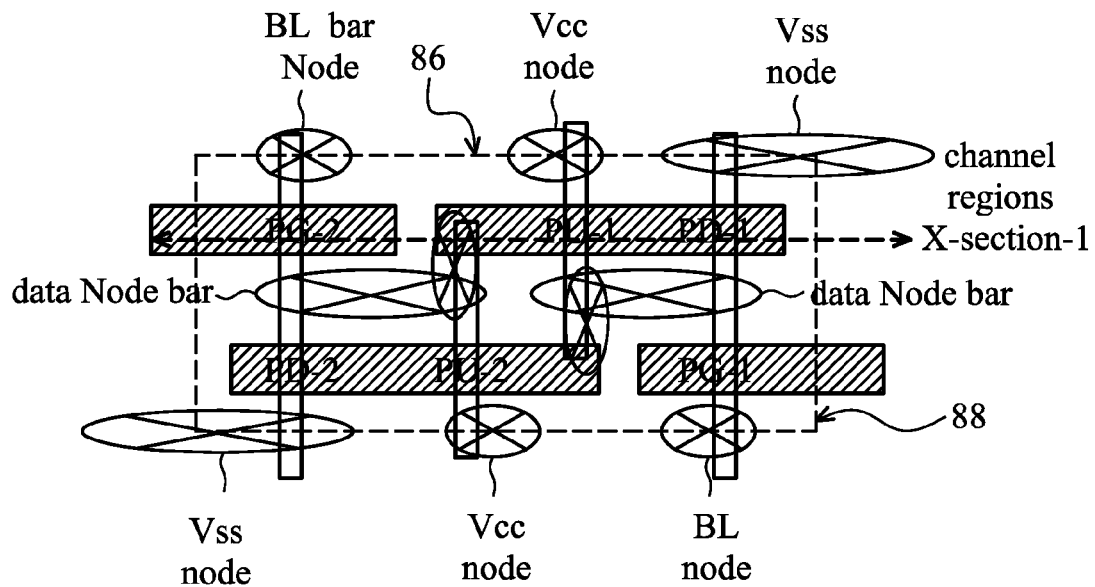
FIGS. 6-7 illustrate an example of how an embodiment integrated circuit including the first FinFET of FIG. 1 with non-tiered first fins and the third FinFET of FIG. 3 having tiered fins may be implemented to form a unit cell of an SRAM.
Figure 7:
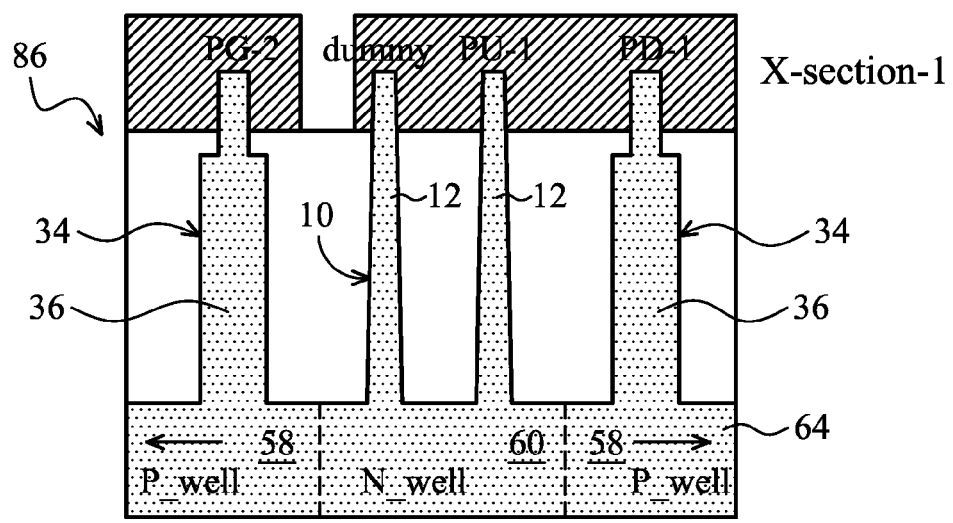

Referring now to FIGS. 6-7, an example of how an embodiment integrated circuit 86 including the first FinFET 10 with non-tiered first fins 12 and the third FinFET 34 having tiered fins 36 may be implemented to form a unit cell 88 of an SRAM. As shown, the non-tiered first fins 12 from the first FinFET 10, which are disposed above an n-well 60 in the substrate 64, form pull-up transistors (PU-1, PU-2). In addition, the tiered third fins 36 from the third FinFET 34, which are disposed above a p-well 58 in the substrate 64, form pull-down and pass gate transistors (PD-1, PD-2, PG-1, PG-2). In an embodiment, one of the first fins 12 is a dummy fin.

Figure 8:
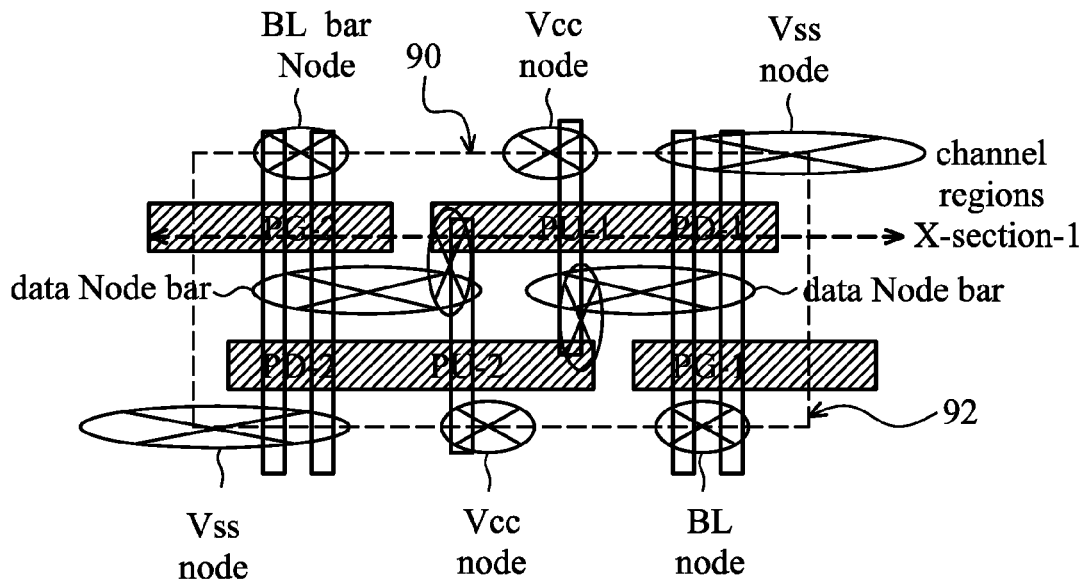
FIGS. 8-9 illustrate another example of how an embodiment integrated circuit including the first FinFET of FIG. 1 with non-tiered first fins and the third FinFET of FIG. 3 having tiered fins may be implemented to form a unit cell of an SRAM.
Figure 9:
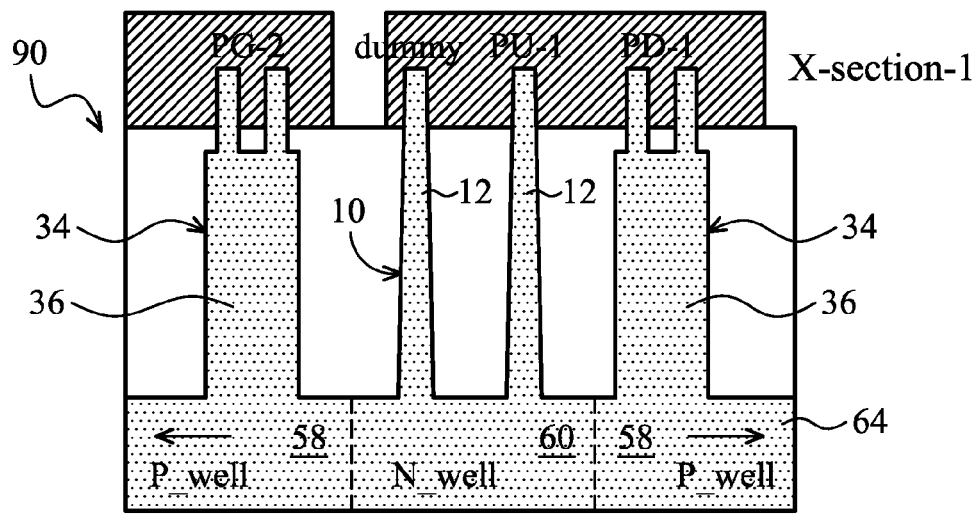

Referring now to FIGS. 8-9, another example of how an embodiment integrated circuit 90 including the first FinFET 10 with non-tiered first fins 12 and the third FinFET 34 having tiered fins 36 may be implemented to form a unit cell 92 of an SRAM. As shown, the non-tiered first fins 12 from the first FinFET 10, which are disposed above an n-well 60 in the substrate 64, form pull-up transistors (PU-1, PU-2). In addition, the tiered third fins 36 from the third FinFET 34, which have been merged together and are disposed above a p-well 58 in the substrate 64, form pull-down and pass gate transistors (PD-1, PD-2, PG-1, PG-2). In an embodiment, one of the first fins 12 is a dummy fin.

Figure 10:
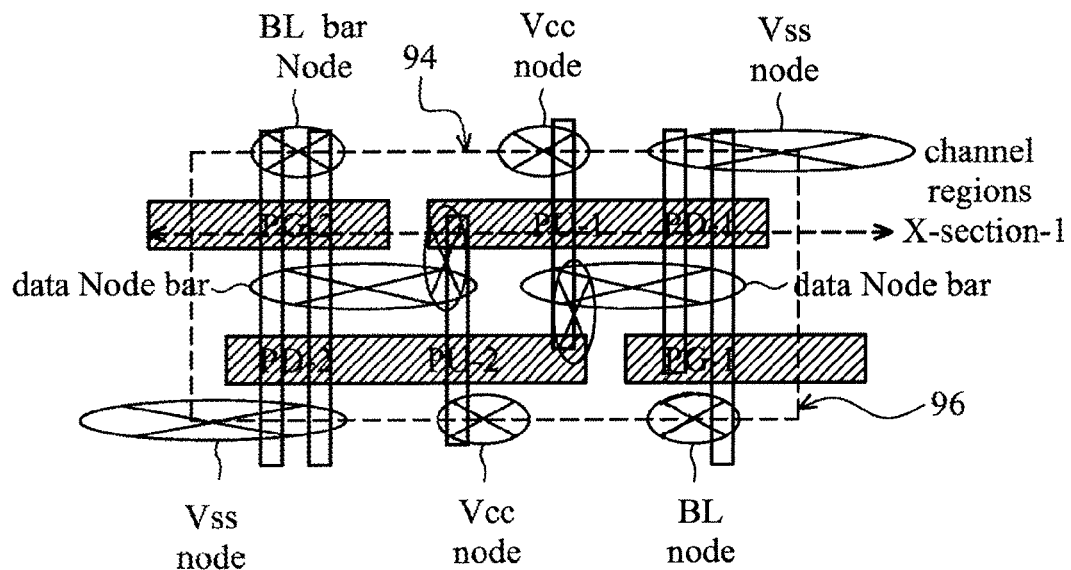
FIGS. 10-11 illustrate another example of how an embodiment integrated circuit including the first FinFET of FIG. 1 with non-tiered first fins and the third FinFET of FIG. 3 having tiered fins may be implemented to form a unit cell of an SRAM.
Figure 11:
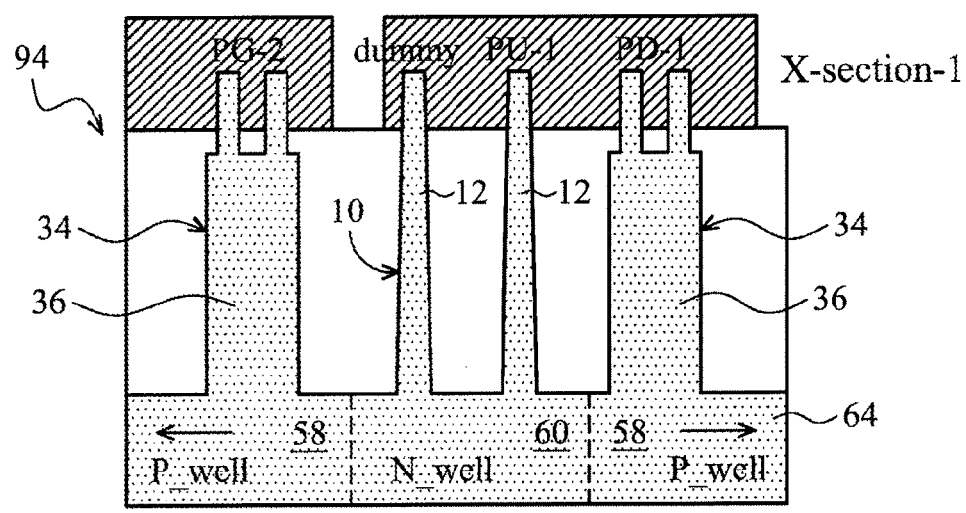

Referring now to FIGS. 10-11, another example of how an embodiment integrated circuit 94 including the first FinFET 10 with non-tiered first fins 12 and the third FinFET 34 having tiered fins 36 may be implemented to form a unit cell 96 of an SRAM. The integrated circuit 92 of FIGS. 10-11 is similar to the integrated circuits 86, 90 of FIGS. 8-9 except that one of the tiered fins 36, as shown in FIG. 10, forming the pass gate transistor (PG-1) is truncated proximate the BL node. As such, the truncated tiered fin 36 does not extend through the gate electrode proximate PG-1. Because the truncated tiered fin 36 is shorter, the ion ratio of the unit cell 96 may have improved stability. In an embodiment, one of the first fins 12 is a dummy fin.

Figure 12:
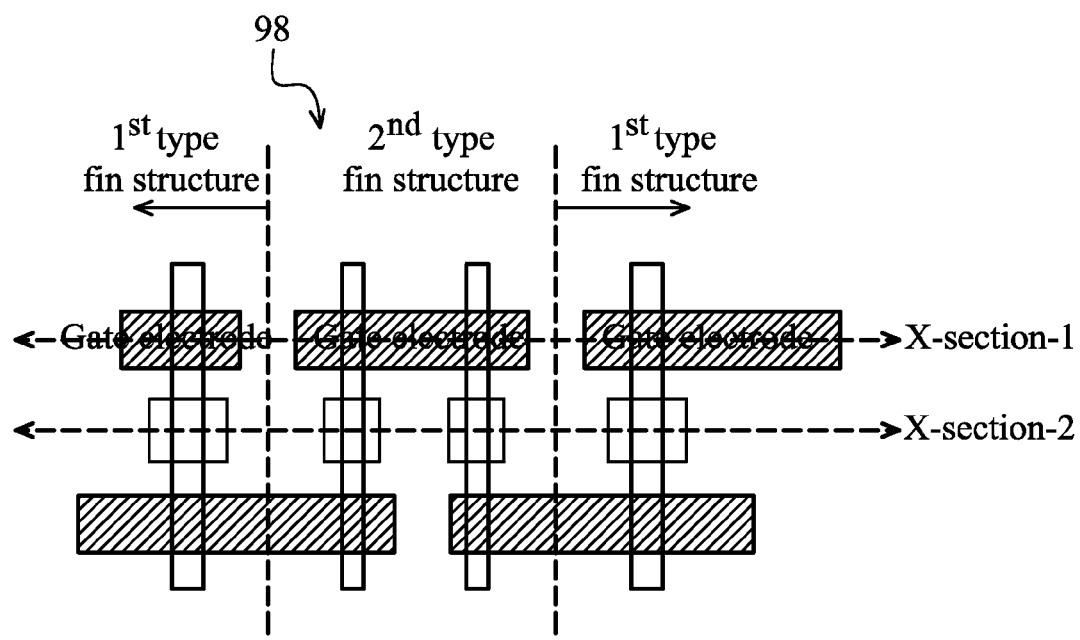
FIGS. 12-14 illustrate an embodiment integrated circuit including the first FinFET of FIG. 1 with non-tiered first fins and the third FinFET of FIG. 3 having tiered fins, and epi-profiles for the devices.
Figure 13:
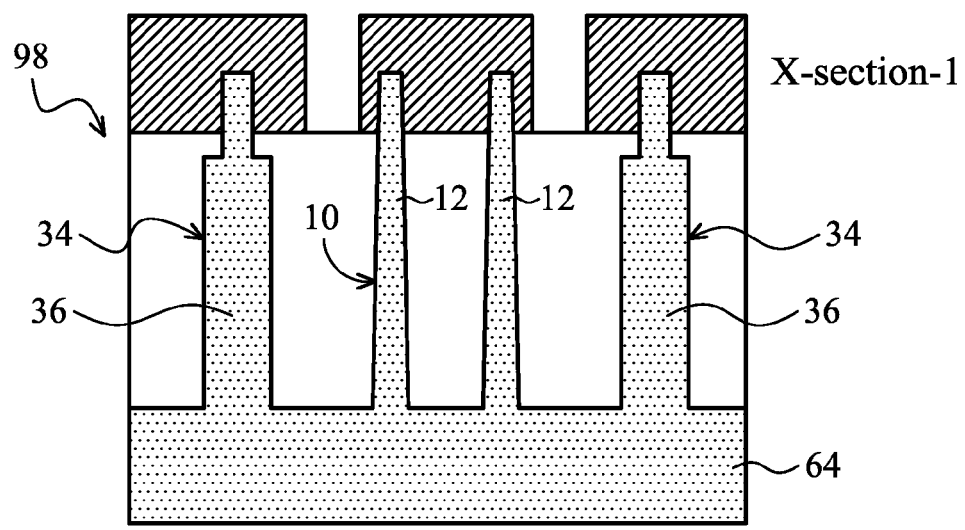
Figure 14:
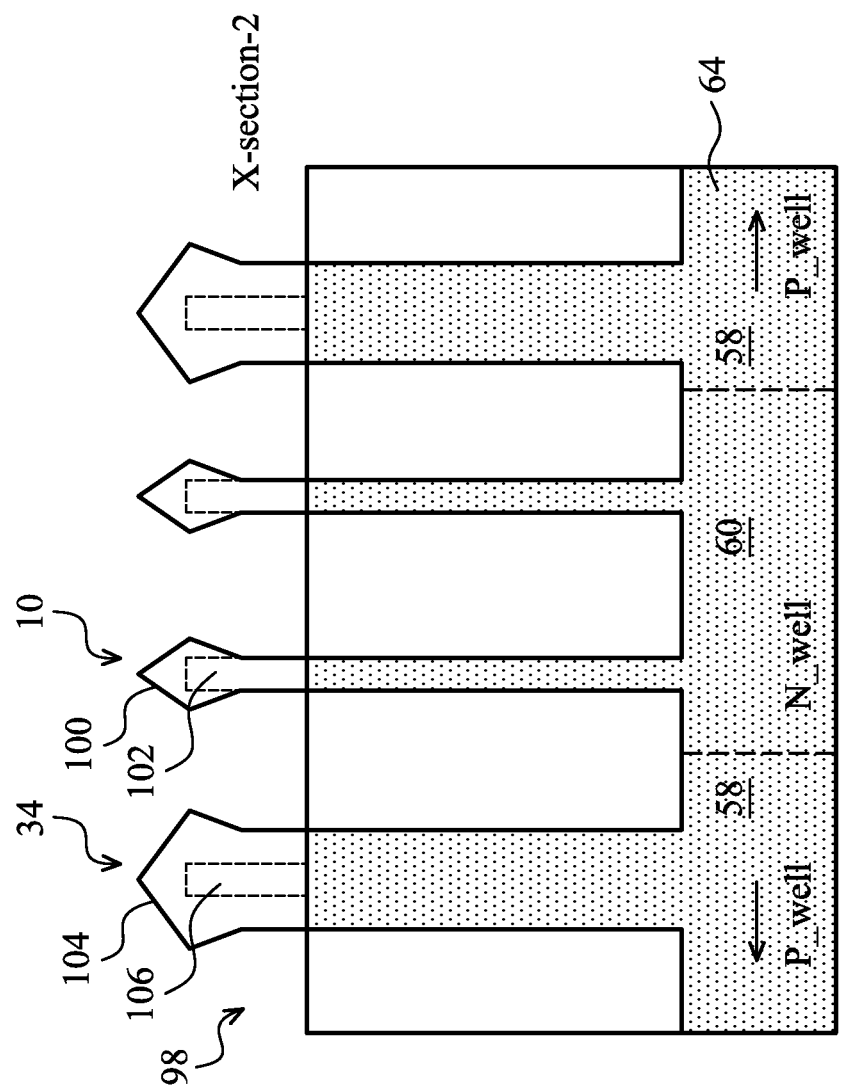

Referring now to FIGS. 12-14, an embodiment integrated circuit 98 including the first FinFET 10 with non-tiered first fins 12 and the third FinFET 34 having tiered fins 36 is illustrated. As shown in FIG. 14, the source/drain regions 100 above channel regions 102 of the first FinFET 10 may have a smaller profile relative the source/drain regions 104 above channel regions 106 of the third FinFET 34. It should be recognized that different profiles having a variety of different shapes and sizes may be used in the first, second, and third FinFET devices 10, 24, 34.

Figure 15:
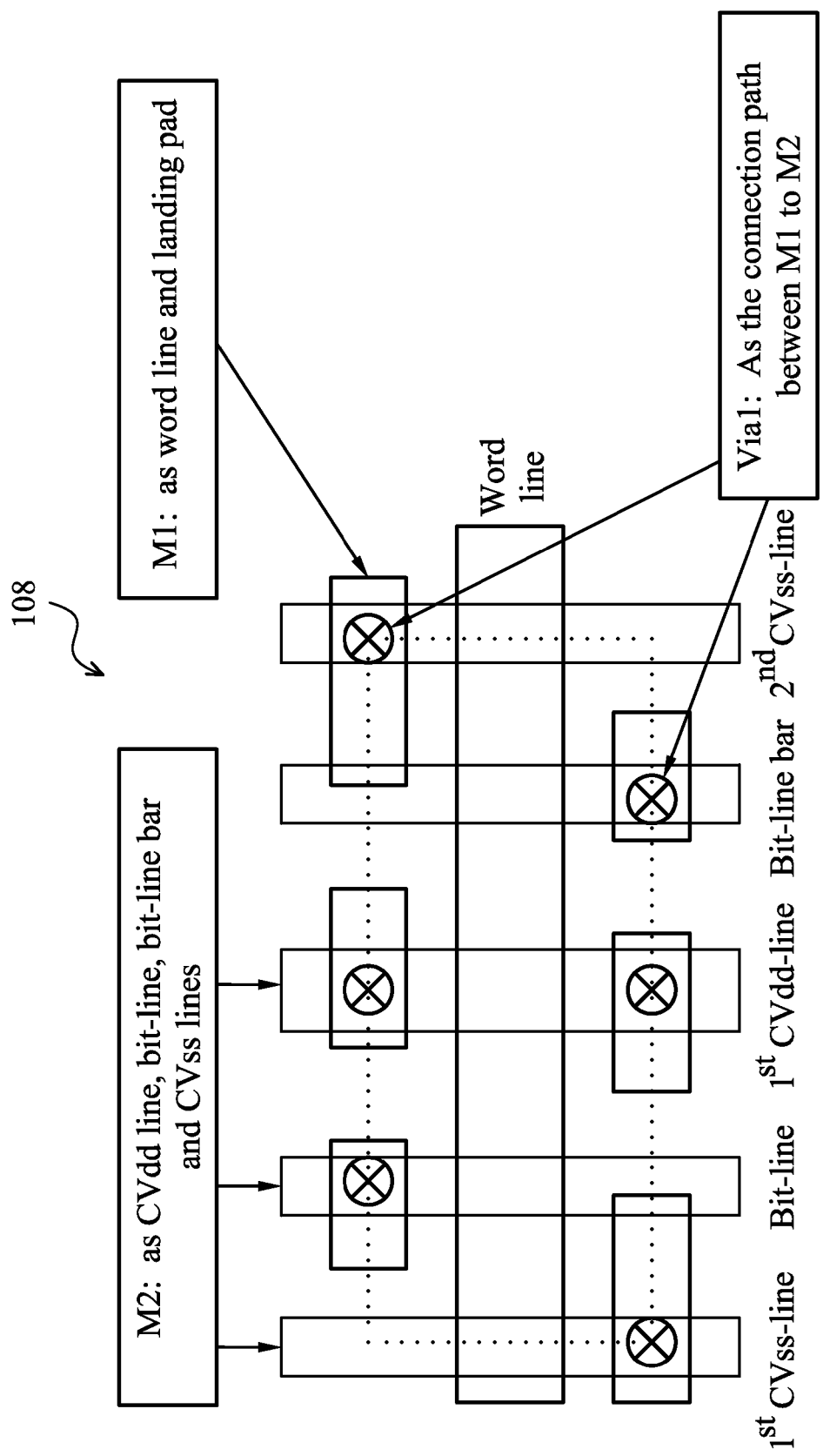
FIGS. 15-17 illustrate embodiment back end of line (BEOL) routing schemes that may be employed for the embodiment SRAM unit cells.
Figure 16:
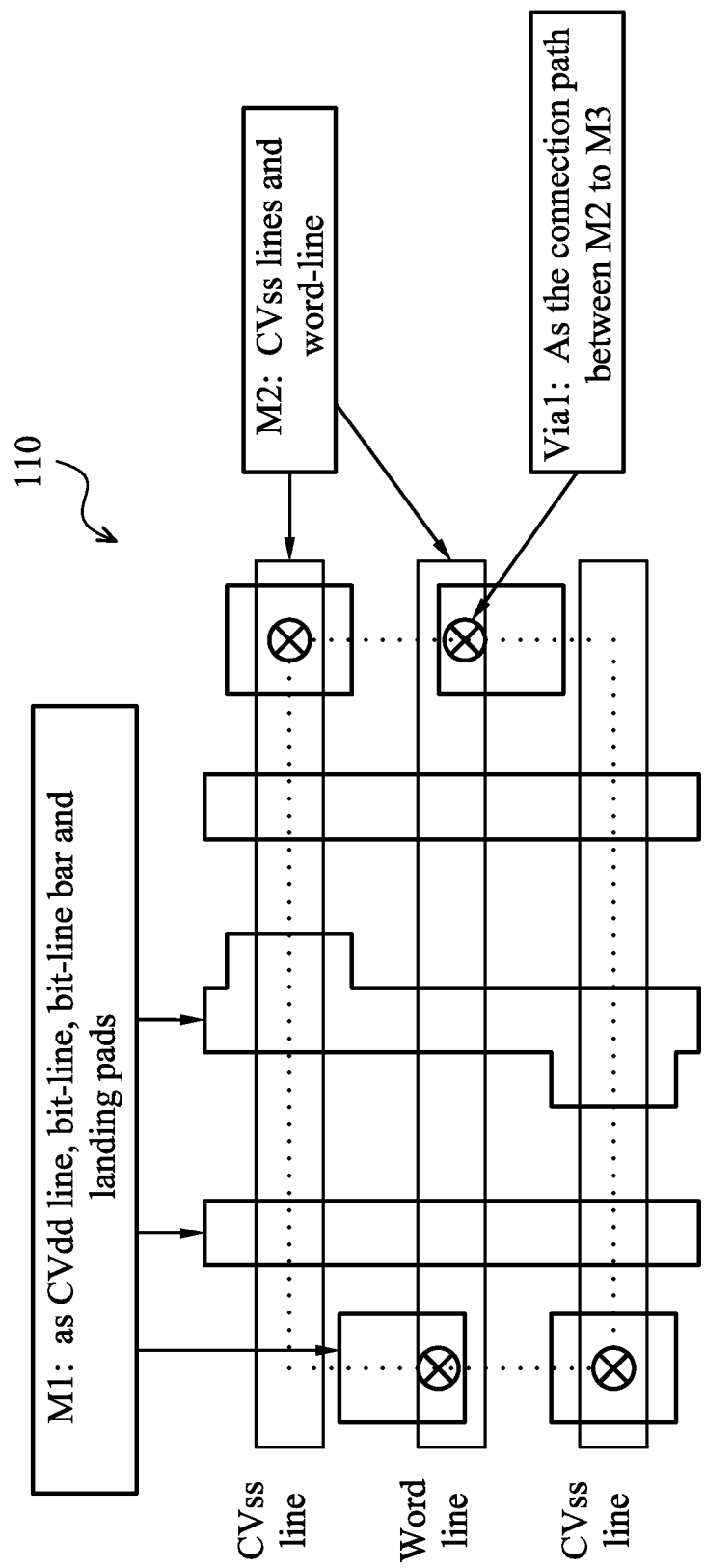
Figure 17:
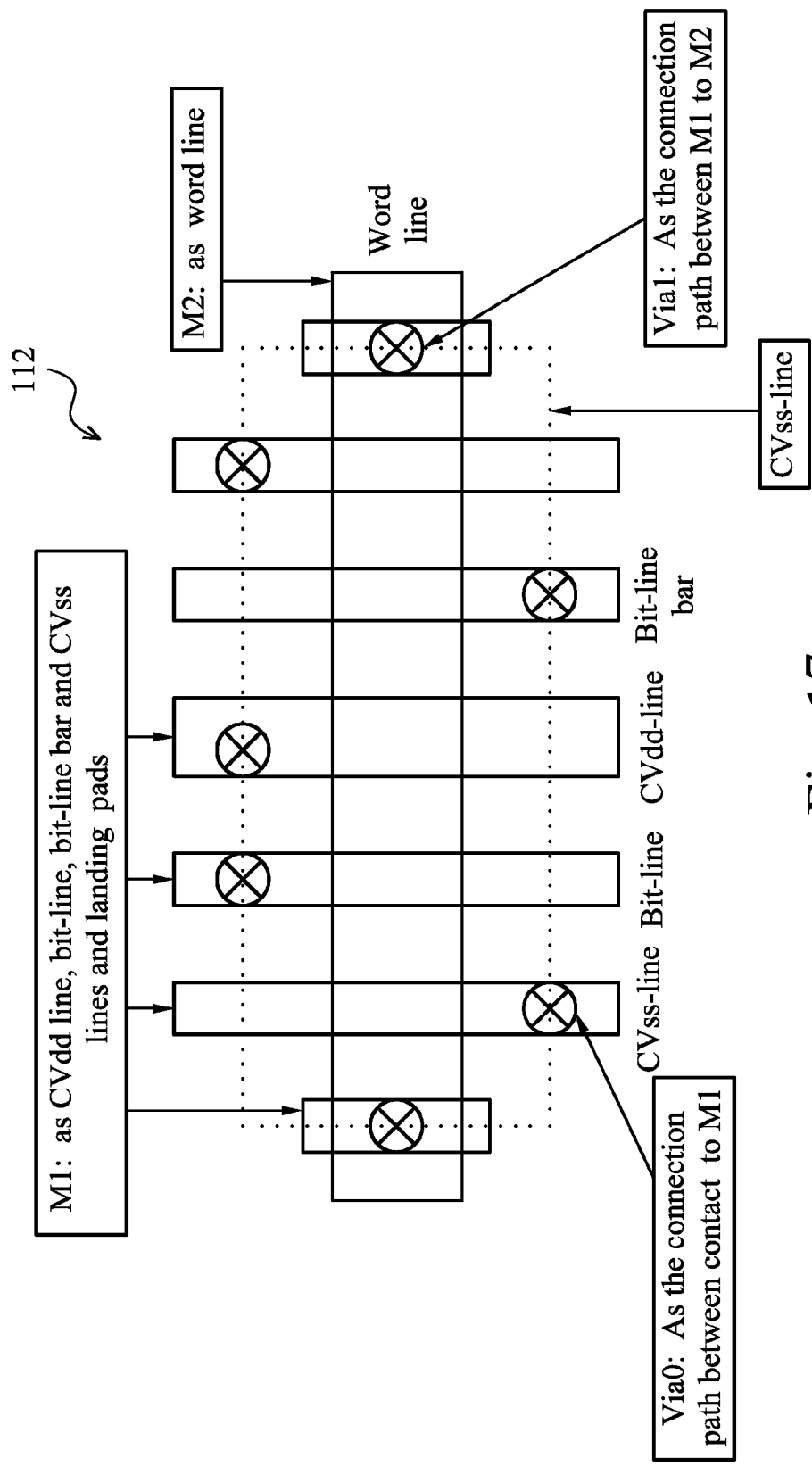

Referring now to FIG. 15, in an embodiment a back end of line (BEOL) routing scheme 108 may be employed for the SRAM unit cells, such as unit cell 88, 92, 96, disclosed herein. In another embodiment, a back end of line (BEOL) routing scheme 110 as shown in FIG. 16 or a back end of line (BEOL) routing scheme 112 as shown in FIG. 17 may be employed.

Figure 18A:
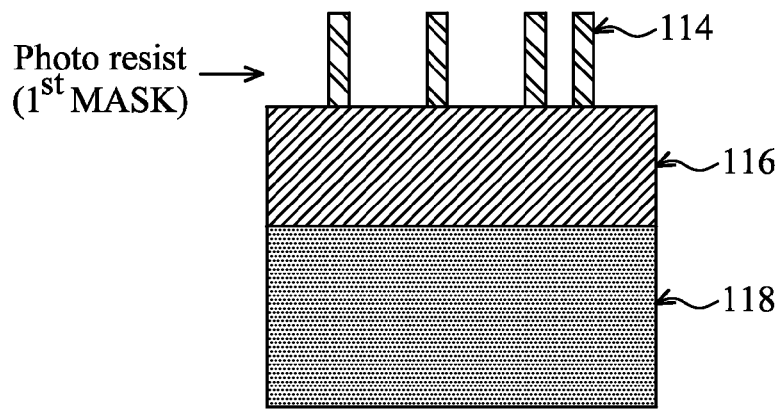
FIGS. 18A-18F schematically illustrate a method of forming an embodiment integrated circuit having the first FinFET of FIG. 1 with non-tiered fins and the third FinFET of FIG. 3 with the tiered fins on the shared substrate.
Figure 18B:
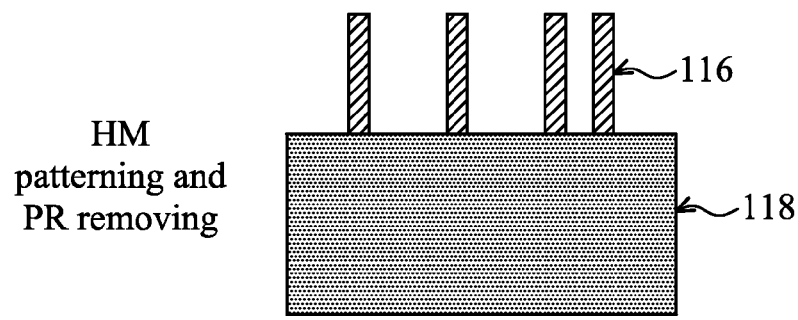
Figure 18C:
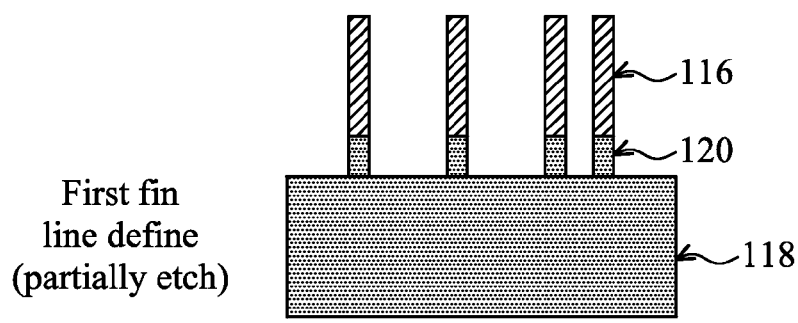
Figure 18D:
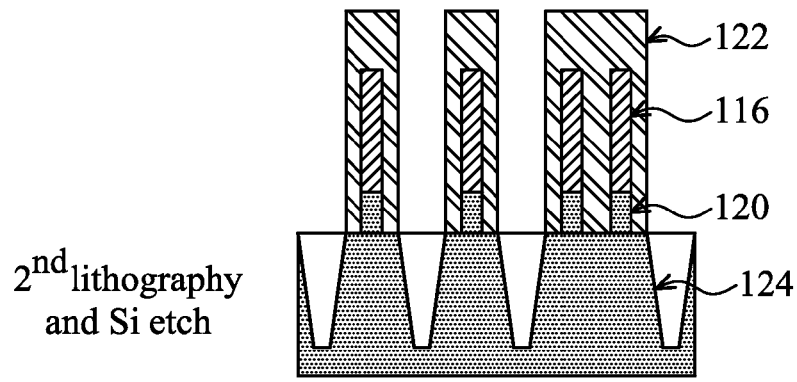
Figure 18E:
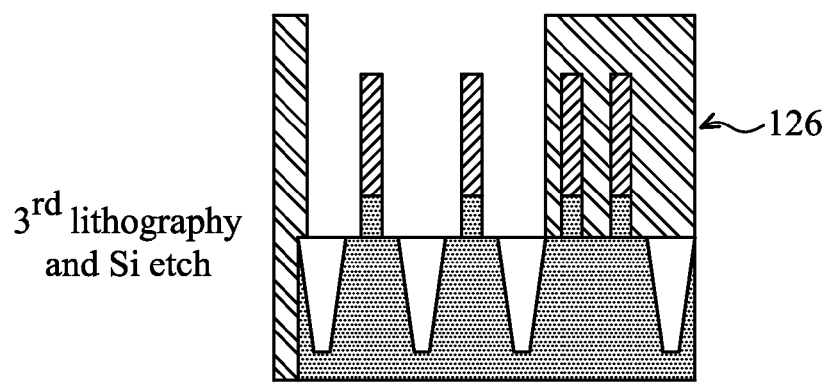
Figure 18F:
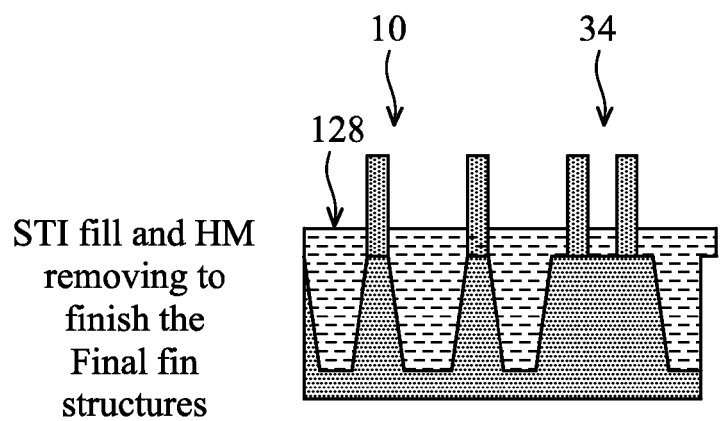

Referring collectively to FIGS. 18A-18F, a method of forming an embodiment integrated circuit having the first FinFET with non-tiered fins and the third FinFET with the tiered fins on the shared substrate is schematically illustrated. In FIG. 18A, a photo resist 114 is placed on hard mask layers 116 disposed over a substrate 118 and a hard mask etch is performed to pattern the hard mask layers. In FIG. 18B, the photo resist 114 has been removed to leave portions of the hard mask layer 116. Thereafter, in FIG. 18C a blanket etch is performed to partially define fins 120. In FIG. 18D, a second photo resist 122 is placed over the partially formed fins 120 and a portion of the substrate 118. Thereafter, a silicon etch is performed to etch the substrate 118 to define the STI regions 124, further define fin profiles, and remove non-used fins, dummy fins, or non-used transistors. In FIG. 18E, a third photo resist 126 is formed over portions of the structure to protected the tiered fins and another etch is performed to produce the non-tiered fins. Next, as shown in FIG. 18F, the STI regions 124 are filled with a material 128 such as, for example, an oxide and the remaining portions of the hard mask layers 116 are removed, which leaves the integrated circuit having the first FinFET 10 with non-tiered fins and the third FinFET 34 with the tiered fins on the shared substrate.

In an embodiment, an integrated circuit is provided. The integrated circuit includes a substrate, a first FinFET device supported by the substrate, the first FinFET device having a first fin with a non-tiered fin profile, and a second FinFET supported by the substrate, the second FinFET having a second fin with a tiered fin profile.

In an embodiment, an integrated circuit is provided. The integrated circuit includes a substrate, a first FinFET device supported by the substrate, the first FinFET device having a first fin extending between source and drain regions and disposed beneath a first gate electrode, the first fin including a non-tiered fin profile, and a second FinFET supported by the substrate, the second FinFET device having a second fin extending between the source and drain regions and disposed beneath a second gate electrode, the second FinFET having a second fin with a tiered fin profile.

In an embodiment, a method of forming an integrated circuit is provided. The method includes forming a first FinFET device over a substrate, the first FinFET device having a first fin with a non-tiered fin profile, and forming a second FinFET over the substrate, the second FinFET having a second fin with a tiered fin profile.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit, comprising:
a substrate;
a first FinFET device supported by the substrate, the first FinFET device having a first fin with a non-tiered fin profile; and
a second FinFET device supported by the substrate, the second FinFET device having a first upper tier and a second upper tier extending from a continuous lower tier, the first upper tier having a different length than the second upper tier, the second FinFET having a tiered fin profile;
wherein a dielectric material extends along sidewalls of the lower tier and between the first upper tier and the second upper tier, an uppermost surface of the dielectric material along sidewalls of the continuous lower tier coplanar with an uppermost surface of the dielectric material between the first upper tier and the second upper tier.

2. The integrated circuit of claim 1, wherein the first FinFET device is employed in one of a static random access memory cell, a dynamic random access memory cell, a fresh cell, and a static random access memory pull-up transistor.

3. The integrated circuit of claim 1, wherein the second FinFET device is employed in one of a logic device, a pull-down transistor, and a pass-gate transistor.

4. The integrated circuit of claim 1, wherein the first FinFET device and the second FinFET device are each p-type metal-oxide-semiconductor field effect transistors.

5. The integrated circuit of claim 1, wherein the first FinFET device is a p-type metal-oxide-semiconductor field effect transistor employed as a pull up transistor in a first static random access memory and the second FinFET device is an n-type metal-oxide-semiconductor field effect transistor employed as one of a pull down transistor and a pass gate transistor in a second static random access memory.

6. The integrated circuit of claim 1, wherein the non-tiered fin profile of the first fin is non-uniform over a length of the first fin.

7. The integrated circuit of claim 1, wherein the first FinFET device is a multiple gate field effect transistor having a plurality of first fins with the non-tiered fin profile.

8. An integrated circuit, comprising:
a substrate;
a first FinFET device supported by the substrate, the first FinFET device having a first fin extending between source and drain regions and disposed beneath a first gate electrode, the first fin including a non-tiered fin profile, a third gate electrode extending over a terminating longitudinal end of the first fin such that the first fin extends from only one sidewall of the third gate electrode in a plan view;
first shallow trench isolations (STIs) along opposing sides of the first fin, an upper surface of the first STIs being planar;
a second FinFET device supported by the substrate, the second FinFET device having a second fin and a third fin extending between source and drain regions and disposed beneath a second gate electrode, the second fin and the third fin including a tiered fin profile comprising an upper tier and a lower tier, the lower tier forming a ledge on opposing sides of the upper tier, wherein the second gate electrode is disposed around only the upper tier of the second fin and the upper tier of the third fin, wherein a longitudinal axis of the upper tier of the second fin and a longitudinal axis of the upper tier of the third fin are substantially parallel along a first direction, the upper tier of the second fin extending along the first direction further than the upper tier of the third fin, the upper tier of the second fin and the upper tier of the third fin extending from a same lower tier; and second STIs along opposing sides of the second fin, the second STIs extending only partially along sidewalls of the upper tier, an upper surface of the second STIs being planar, the upper surface of the first STIs and the second STIs being coplanar.

9. The integrated circuit of claim 8, wherein a width of the lower tier of the second fin with the tiered fin profile is at least twice a width of the upper tier of the second fin.

10. The integrated circuit of claim 8, wherein the non-tiered fin profile of the first fin is non-uniform over a length of the first fin.

11. The integrated circuit of claim 8, wherein a height of the upper tier of the second fin is less than about fifty nanometers.

12. The integrated circuit of claim 8, wherein the first FinFET device is formed above a first well with a first doping type and the second FinFET device is formed above a second well with a second doping type different from the first doping type.

13. The integrated circuit of claim 8, wherein the first FinFET device includes a dummy fin extending between the source and drain regions and disposed beneath the first gate electrode.

14. The integrated circuit of claim 8, wherein the first FinFET device forms a pull up transistor.

15. The integrated circuit of claim 8, wherein the second FinFET device forms at least one of a pull down transistor and a pass gate transistor.

16. A method of forming an integrated circuit, comprising:

forming a first FinFET device over a substrate, the first FinFET device having a first fin with a non-tiered fin profile; and forming a second FinFET over the substrate, the second FinFET having a second fin and a third fin each with a tiered fin profile providing an upper tier and a lower tier, wherein the lower tier forms a step along opposing sides of the upper tier, wherein a longitudinal axis of the upper tier of the second fin and a longitudinal axis of the upper tier of the third fin are substantially parallel along a first direction, the upper tier of the second fin extending along the first direction further than the upper tier of the third fin, the upper tier of the second fin and the upper tier of the third fin extending from a same lower tier;

wherein the forming the first FinFET and the forming the second FinFET comprises, after forming the first fin, the second fin, and the third fin, forming an isolation material adjacent the first fin, the second fin, and the third fin, the isolation material extending between the upper tier of the second fin and the upper tier of the third fin, the isolation material having a planar upper surface.

17. The method of claim 16, wherein the forming the first FinFET and the forming the second FinFET further comprises forming a first gate electrode over the first fin, a second gate electrode over the second fin, and a third gate electrode over the third fin.

18. The integrated circuit of claim 1, wherein the second FinFET includes one or more additional upper tiers extending from the continuous lower tier.

19. The method of claim 16, wherein a width of the lower tier is at least twice a width of the upper tier.

20. The integrated circuit device of claim 8, wherein the second FinFET comprises another upper tier on the lower tier.

* * * * *